(12) United States Patent
Adusumilli et al.

(10) Patent No.: US 9,831,254 B1
(45) Date of Patent: Nov. 28, 2017

(54) MULTIPLE BREAKDOWN POINT LOW RESISTANCE ANTI-FUSE STRUCTURE

(71) Applicant: International Business Machines Corporation, Armonk, NY (US)

(72) Inventors: Praneet Adusumilli, Albany, NY (US); Adra V. Carr, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/273,344

(22) Filed: Sep. 22, 2016

(51) Int. Cl.
*H01L 27/112* (2006.01)
*H01L 23/525* (2006.01)
*H01L 29/78* (2006.01)

(52) U.S. Cl.
CPC .... *H01L 27/11206* (2013.01); *H01L 23/5252* (2013.01); *H01L 29/785* (2013.01)

(58) Field of Classification Search
CPC ............. H01L 27/11206; H01L 29/785; H01L 23/5252
See application file for complete search history.

(56) References Cited

U.S. PATENT DOCUMENTS

| | | | |
|---|---|---|---|
| 7,087,499 B2 | 8/2006 | Rankin et al. | |
| 8,742,457 B2 * | 6/2014 | Yang | H01L 23/5252 257/183 |
| 8,848,423 B2 | 9/2014 | Chung | |
| 9,159,734 B2 | 10/2015 | Hafez et al. | |
| 9,165,936 B2 | 10/2015 | Ponoth et al. | |
| 9,502,502 B2 * | 11/2016 | Pan | H01L 29/0847 |
| 2011/0031582 A1 | 2/2011 | Booth, Jr. et al. | |
| 2012/0314473 A1 | 12/2012 | Chung | |
| 2014/0015095 A1 | 1/2014 | Hui et al. | |
| 2014/0179070 A1 | 6/2014 | Yang | |
| 2014/0346603 A1 | 11/2014 | Toh et al. | |
| 2016/0027918 A1 * | 1/2016 | Kim | H01L 29/7848 257/401 |
| 2017/0012129 A1 * | 1/2017 | Basker | H01L 29/7851 |

OTHER PUBLICATIONS

Y. Liu et al., "Anti-fuse memory array embedded in 14nm FinFET CMOS with novel selector-less bit-cell featuring self-rectifying characteristics," Symposium on VLSI Technology, Jun. 2014, 2 pages.

P. C. Peng et al., "High-Density FinFET One-Time Programmable Memory Cell With Intra-Fin-Cell-Isolation Technology", IEEE Electron Device Letters, Oct. 2015, pp. 1037-1039, vol. 36, No. 10.

A. Praneet et al., "Metal FinFET Anti-Fuse," U.S. Appl. No. 15/099,199, filed Apr. 14, 2016.

\* cited by examiner

*Primary Examiner* — William Coleman
(74) *Attorney, Agent, or Firm* — Scully, Scott, Murphy & Presser, P.C.; Daniel P. Morris, Esq.

(57) ABSTRACT

An anti-fuse structure is provided that contains multiple breakdown points which result in low resistance after the anti-fuse structure is blown. The anti-fuse structure is provided using a method that is compatible with existing FinFET device processing flows without requiring any additional processing steps.

20 Claims, 2 Drawing Sheets

MULTIPLE BREAKDOWN POINT LOW RESISTANCE ANTI-FUSE STRUCTURE

BACKGROUND

The present application relates to a semiconductor structure and a method of forming the same. More particularly, the present application relates to a semiconductor structure including a FinFET anti-fuse structure that contains multiple breakdown points and a method of forming the same.

An anti-fuse is an electrical device that performs the opposite function to a fuse. Whereas a fuse starts with a low resistance and is designed to permanently break an electrically conductive path (typically when the current through the path exceeds a specified limit), an anti-fuse starts with a high resistance and is designed to permanently create an electrically conductive path (typically when the voltage across the anti-fuse exceeds a certain level).

Programmable on-chip anti-fuses are needed in many circuit applications. In some applications, it preferable to fabricate on-chip anti-fuses during FinFET CMOS fabrication in order to minimize process cost and improve system integration. The breakdown voltage of conventional planar anti-fuses with a gate dielectric is too high. Also, planar anti-fuses use too much area compatible with current ground rules of 14 nm, 10 nm or 7 nm technology. Therefore, there is a need for improved on-chip FinFET compatible anti-fuses.

SUMMARY

An anti-fuse structure is provided that contains multiple breakdown points which result in low resistance after the anti-fuse structure is blown. The anti-fuse structure is provided using a method that is compatible with existing FinFET device processing flows without requiring any additional processing steps.

In one aspect of the present application, a semiconductor structure is provided. In one embodiment, the semiconductor structure includes an anti-fuse structure located on a surface of a substrate. The anti-fuse structure includes a semiconductor fin extending upward from a portion of the substrate. A doped semiconductor material structure having a faceted surface is located surrounding the semiconductor fin. A dielectric liner is located on the substrate and the doped semiconductor material structure, and an anti-fuse metal structure is located on the dielectric liner.

In another aspect of the present application, a method of forming an anti-fuse structure is provided. In one embodiment of the present application, the method may include forming a semiconductor fin extending upward from a surface of a substrate and in an anti-fuse device region of the substrate. A doped semiconductor material structure having a faceted surface is then formed to surround the semiconductor fin. Next, a dielectric liner is formed on the substrate and the doped semiconductor material structure. An anti-fuse metal structure is then formed on the dielectric liner.

DETAILED DESCRIPTION

Figure 1:
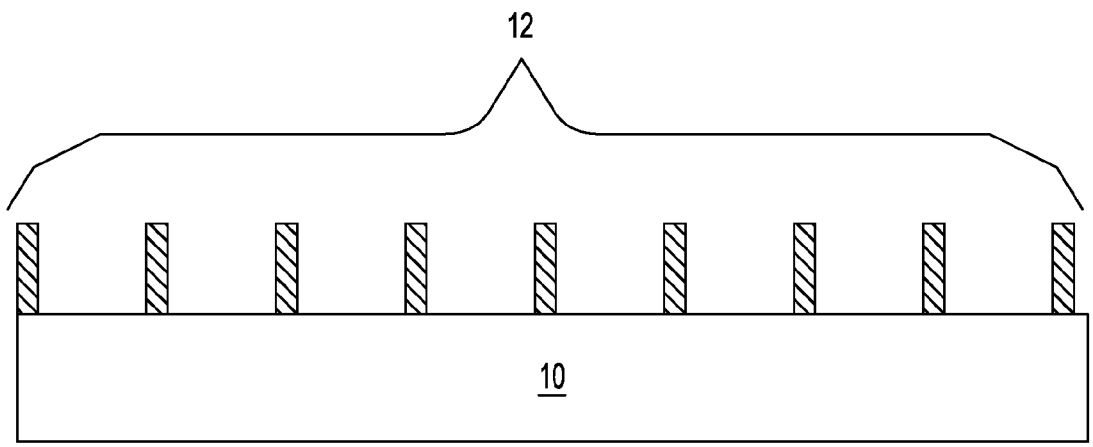
FIG. 1 is a cross sectional view of an exemplary semiconductor structure within an anti-fuse device region that includes a plurality of semiconductor fins, each semiconductor fin of the plurality of semiconductor fins extending upward from a different portion of a topmost surface of a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in one embodiment of the present application. The exemplary structure illustrates an anti-fuse device region in which the anti-fuse structure of the present application will be subsequently formed. Other device regions such as, for example, FinFET device regions, may lie to the periphery of the anti-fuse device region illustrated in FIG. 1.

The exemplary semiconductor structure of FIG. 1 includes a plurality of semiconductor fins 12, each semiconductor fin 12 of the plurality of semiconductor fins extending upward from a different portion of a topmost surface of a substrate 10. In FIG. 1, nine semiconductor fins 12 are shown by one example. Although a plurality of semiconductor fins 12 are described and illustrated, the present application can be employed when only a single semiconductor fin 12 is formed.

In one embodiment of the present application, substrate 10 may be an insulator layer of a semiconductor-on-insulator (SOI) substrate. In such an embodiment, a handle substrate (not shown) may be present beneath the insulator layer. In another embodiment of the present application, substrate 10 is a remaining portion of a bulk semiconductor substrate.

The exemplary structure shown in FIG. 1 can be formed by first providing an initial substrate. The initial substrate may be a bulk semiconductor substrate that is composed entirely of at least one semiconductor material; the bulk semiconductor substrate does not contain any dielectric and/or conductive materials. In such an embodiment, the substrate and each semiconductor fin 12 that results from processing the bulk semiconductor substrate may be composed of a same, or different, semiconductor material. The semiconductor material that provides the bulk semiconductor substrate may include any material, or stack of materials, having semiconducting properties including, but not limited to, silicon (Si), germanium (Ge), silicon germanium (SiGe) alloys, III-V compound semiconductors, or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the initial substrate is a bulk semiconductor substrate that is composed entirely of silicon or a silicon germanium alloy.

The semiconductor material or materials that provide(s) the bulk semiconductor substrate may have any of the well known crystal orientations. For example, the crystal orientation of the bulk semiconductor structure may be {100}, {110}, or {111}. Other crystallographic orientations besides those specifically mentioned can also be used in the present application. At least an upper portion of the bulk semiconductor substrate which is processed into the semiconductor fins 12 is single crystalline.

In another embodiment, a semiconductor-on-insulator (SOI) substrate can be used as the initial substrate. The SOI substrate may include a handle substrate, an insulator layer and a topmost semiconductor material layer. The topmost semiconductor material layer of the SOI substrate will be subsequently processed into the semiconductor fins 12 shown in FIG. 1. The initial substrate may also be composed of an insulator layer and a topmost semiconductor material layer.

In one embodiment, the handle substrate may be composed of one of the semiconductor materials mentioned above. When the handle substrate is composed of at least one semiconductor material, the at least one semiconductor material that provides the handle substrate may be single crystalline, polycrystalline or amorphous. In one example, the handle substrate is composed of single crystalline silicon or a single crystalline silicon germanium alloy. In other embodiments, the handle substrate may be composed of a non-semiconductor material including, for example, a dielectric material and/or a conductive material.

The insulator layer may be a crystalline or non-crystalline dielectric material such as an oxide and/or a nitride. In one embodiment, the insulator layer is a dielectric oxide such as, for example, silicon dioxide. In another embodiment of the present application, the insulator layer may be a dielectric nitride such as, for example, silicon nitride or boron nitride. In yet another embodiment of the present application, the insulator layer may include a stack of a dielectric oxide and a dielectric nitride. In one example, a stack of, in any order, silicon dioxide and silicon nitride or boron nitride may be employed as the insulator layer. The insulator layer may have a thickness from 10 nm to 200 nm, although other thicknesses that are lesser than, or greater than, the aforementioned thickness range may also be employed as the thickness of the insulator layer.

The topmost semiconductor material layer of the SOI substrate includes one of the semiconductor materials mentioned above for the bulk semiconductor substrate. The semiconductor material that provides the topmost semiconductor material layer of the SOI may be a relaxed semiconductor material or a strained semiconductor material. In one embodiment, the semiconductor material that provides the topmost semiconductor material layer includes a same semiconductor material as the handle substrate. In one example, silicon is employed as the semiconductor material for both the handle substrate and the topmost semiconductor material layer of the SOI substrate. In another embodiment, the topmost semiconductor material layer of the SOI substrate includes a semiconductor material that differs from a semiconductor material that provides the handle substrate. In one example, the handle substrate may be composed of silicon, while the topmost semiconductor material layer may be composed of a silicon germanium alloy.

The topmost semiconductor material layer of the SOI substrate may have one of the crystal orientations mentioned above for the semiconductor material that provides the bulk semiconductor substrate. In one embodiment, the crystal orientation of the topmost semiconductor material layer of the SOI substrate is the same as the crystal orientation of the handle substrate. In another embodiment, the crystal orientation of the topmost semiconductor material layer of the SOI substrate differs from the crystal orientation of the handle substrate. Typically, the topmost semiconductor material layer of the SOI substrate is a single crystalline semiconductor material. The topmost semiconductor material layer of the SOI substrate may have a thickness from 10 nm to 100 nm, although other thicknesses that are lesser than, or greater than, the aforementioned thickness range may also be employed as the thickness of the topmost semiconductor material layer of the SOI substrate.

In one embodiment, the SOI substrate may be formed by wafer bonding. In yet another embodiment, the SOI substrate may be formed by an implantation process known as SIMOX (i.e., Separation by IMplanting OXygen). In some embodiments of the present application, a thermal mixing process or a thermal condensation process may be employed in forming the topmost semiconductor material layer of the SOI substrate. Thermal mixing includes annealing in an inert ambient (i.e., helium and/or argon), while thermal condensation includes annealing in an oxidizing ambient (air, oxygen, ozone and/or NO$_2$). The anneal temperature for both thermal mixing and thermal condensation can be from 600° C. to 1200° C. In such a process, a sacrificial silicon germanium alloy layer having a first germanium content can formed on a silicon layer that is located atop the insulator layer. One of thermal mixing or thermal condensation can then be performed to convert the Si/SiGe material stack into a silicon germanium alloy layer having a second germanium content that differs from the first germanium content. The silicon germanium alloy having the second germanium content can be used as the topmost semiconductor material layer of SOI substrate.

After providing the initial substrate (bulk or SOI), a patterning process is used to define each semiconductor fin 12. In one embodiment, the patterning process used to define each semiconductor fin 12 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In some embodiments, the etch stops on a topmost surface of the insulator layer. In other embodiments, the etch may stop within a remaining portion of a bulk semiconductor substrate.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In yet another embodiment, the patterning process may include a direct self-assembly (DSA) patterning process.

As used herein, a "semiconductor fin" refers to a contiguous semiconductor material, and including a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 12 may have a width from 4 nm to 30 nm; the height of the semiconductor fins 12 may be from 10 nm to 150 nm. Other widths and heights that are lesser than, or greater than the ranges mentioned herein can also be used in the present application. Each semiconductor fin 12 can be separated by a pitch of from 20 nm to 100 nm.

Figure 2:
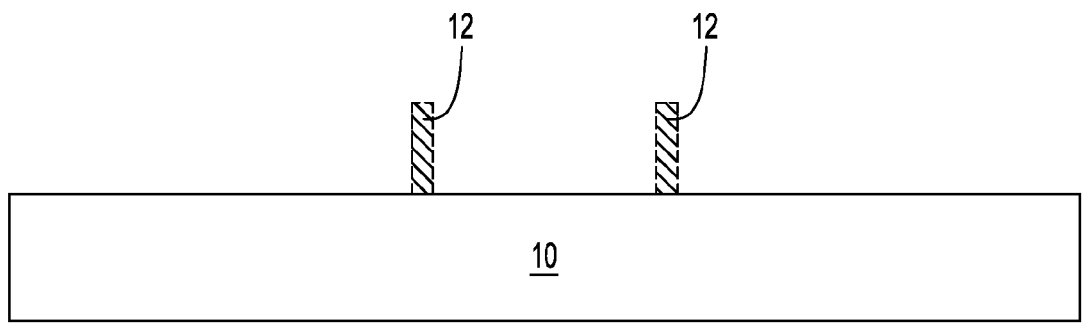
FIG. 2 is a cross sectional view of the exemplary semiconductor structure of FIG. 1 after removing some of the semiconductor fins of the plurality of semiconductor fins, while maintaining at least one semiconductor fin of the plurality of semiconductor fins on the substrate.

Referring now to FIG. 2, there is illustrated the exemplary semiconductor structure of FIG. 1 after removing some of the semiconductor fins 12 of the plurality of semiconductor fins, while maintaining at least one semiconductor fin 12 of the plurality of semiconductor fins on the substrate 10. In some embodiments of the present application, this step of the present application may be omitted. The removal of some of the semiconductor fins 12 can be achieved by forming a block mask over each semiconductor fin 12 that is to remain in the structure, and then the exposed semiconductor fins 12 can be removed utilizing a selective etch process. After removing some of the semiconductor fins 12, the block mask is removed utilizing a block mask stripping process.

Prior to, or after removing some of the semiconductor fins, a sacrificial gate structure (not shown) can be formed straddling a portion of each semiconductor fin 12 as is known in any conventional FinFET processing flow. So as not to obscure the present application, details concerning sacrificial gate structure formation are not provided herein.

Figure 3:
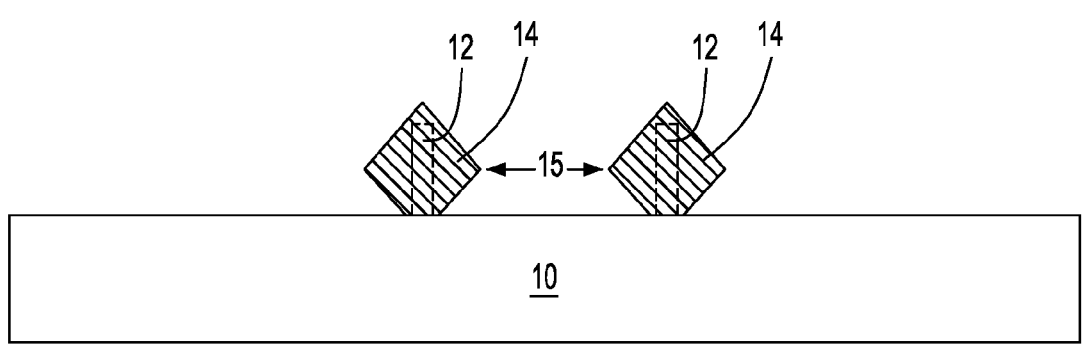
FIG. 3 is a cross sectional view of the exemplary semiconductor structure of FIG. 2 after forming a doped semiconductor material structure having a faceted surface surrounding each remaining semiconductor fin.

Referring now to FIG. 3, there is illustrated the exemplary semiconductor structure of FIG. 2 after forming a doped semiconductor material structure 14 having a faceted surface surrounding each remaining semiconductor fin 12. In FIG. 3 and the remaining drawings, each semiconductor fin 12 is shown with dotted lines to emphasize that a semiconductor fin 12 is surrounded (on each side as well as a topmost surface) by a doped semiconductor material structure 14. When multiple doped semiconductor material structures 14 are formed, each doped semiconductor material structure 14 is separated from its nearest neighboring doped semiconductor material structure 14 by gap 15. Thus, each doped semiconductor material structure 14 remains unmerged and each doped semiconductor material structure 14 is not in intimate contact with another doped semiconductor material structure 14.

Each doped semiconductor material structure 14 has one sidewall surface that has a sharp corner and thus this sidewall of the faceted structures is not perpendicular with the horizontal surface of the underlying substrate 10. In one embodiment, and as is illustrated, each doped semiconductor material structure 14 is diamond shaped. Each diamond shaped doped semiconductor material structure 14 has three apexes or tips; one of the apexes or tips is positioned directly over a topmost surface of a semiconductor fin 12, the other two apexes or tips are located on opposing sides of a semiconductor fin 12. The two apexes or tips located on opposing sides of the semiconductor fin 12 represent an outermost portion of a triangularly shaped material that is epitaxially grown from each sidewall of the semiconductor fin 12. The apex or tip located directly above the topmost surface of the semiconductor fin 12 represents an outermost portion of the two triangular shapes that merge above the semiconductor fin 12 and provide the diamond shaped doped semiconductor material structure 14 shown in FIG. 3. In some embodiments, the doped semiconductor material structure 14 is bounded by (111) planes to each sidewall of the semiconductor fin 12.

Each doped semiconductor material structure 14 includes a semiconductor material and a p-type or n-type dopant. The semiconductor material that provides each doped semiconductor material structure 14 includes one of the semiconductor materials mentioned above for the bulk semiconductor substrate. In one embodiment, the semiconductor material that provides each doped semiconductor material structure 14 may be composed of a same semiconductor material as each semiconductor fin 12. In one example, each doped semiconductor material structure 14 and each semiconductor fin 12 may be composed of silicon. In such an embodiment, no material interface exists between the doped semiconductor material structure 14 and the underling semiconductor fin 12. In another embodiment, the semiconductor material that provides each doped semiconductor material structure 14 may be composed of a different semiconductor material than the semiconductor material used to provide each semiconductor fin 12. In one example, each semiconductor fin 12 may be composed of silicon, while each doped semiconductor material structure 14 may be composed of a silicon germanium alloy. In such an embodiment, a material interface exists between the doped semiconductor material structure 14 and the underling semiconductor fin 12.

The term "n-type dopant" refers to an impurity that when added to an intrinsic semiconductor material contributes free electrons to the intrinsic semiconductor material. In a silicon containing material, examples of n-type dopants include, but are not limited to, antimony, arsenic and/or phosphorus. The term "p-type dopant" refers to an impurity that when added to an intrinsic semiconductor material creates to deficiencies of valance electrons. In a silicon containing semiconductor material, examples of p-type dopants include, but are not limited to, boron, aluminum, gallium and/or indium. In some embodiments, the concentration of dopants within each doped semiconductor material structure 14 can be in a range from $2 \times 10^{20}$ atoms/cm$^3$ to $2 \times 10^{21}$ atoms/cm$^3$; although other dopant concentrations that are lesser than, or greater than, the aforementioned range may also be employed in the present application.

Each doped semiconductor material structure 14 can be formed utilizing a selective epitaxial growth process. In a selective epitaxial growth process, semiconductor material used in providing each doped semiconductor material structure 14 is grown only from exposed surfaces of another semiconductor material, i.e., the semiconductor fins 12. The dopant can be added during the epitaxial growth process, or the dopant can be introduced after the epitaxial growth process utilizing one of ion implantation or gas phase doping.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing each doped semiconductor material structure 14, each doped semiconductor material structure 14 has an epitaxial relationship with the exposed growth surfaces of a semiconductor fin 12.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each doped semiconductor material structure 14 can be performed utilizing any well known precursor gas or gas mixture. Carrier gases like hydrogen, nitrogen, helium and argon can be used. As mentioned above, a dopant source can be introduced into the precursor or precursor gas mixture during the epitaxial growth of each doped semiconductor material structure 14.

At this point of the present application, the exemplary semiconductor structure shown in FIG. 3 may be protected by forming at least one protective material (not shown) such as, for example, an oxide liner and a polysilicon layer. The at least one protective material may be formed by a deposition process, followed by an optional planarization process. After forming the at least one protective material, other regions of the substrate including other devices, such as, for example, FinFETs, can be initially processed. For example, source/drain regions, and/or gate spacers can be formed within a device region in which a FinFET is to be formed. After performing the initial processing within the other device regions, the at least one protective material can be removed from the exemplary semiconductor structure shown in FIG. 3.

Figure 4:
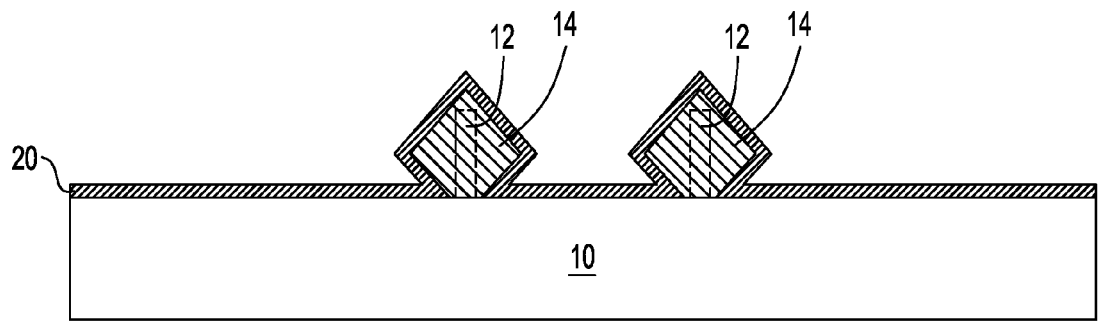
FIG. 4 is a cross sectional view of the exemplary semiconductor structure of FIG. 3 after forming a dielectric liner.

Referring now to FIG. 4, there is illustrated the exemplary semiconductor structure of FIG. 3 after forming a dielectric liner 20. The dielectric liner 20 is formed on the entirety of each doped semiconductor material structure 14 (including the faceted surfaces) as well as the exposed portions of the topmost surface of the remaining portion of the substrate 10.

Dielectric liner 20 is composed of a same dielectric material as that used in providing a gate dielectric of a functional gate structure (not shown). The dielectric liner 20 may include a dielectric oxide, dielectric nitride, and/or dielectric oxynitride. In one example, the dielectric material that provides the dielectric liner 20 as well as the gate dielectric of the functional gate structure can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the dielectric liner 20.

The dielectric material used in providing the dielectric liner 20 as well as the gate dielectric of the functional gate structure can be formed by any deposition process including, for example, chemical vapor deposition (CVD), plasma enhanced chemical vapor deposition (PECVD), physical vapor deposition (PVD), sputtering, or atomic layer deposition (ALD). Dielectric liner 20 may have a thickness from 5 nm to 20 nm; although other thicknesses that are lesser than, or greater than the aforementioned thickness range can also be used as the thickness of the dielectric liner 20.

Figure 5:
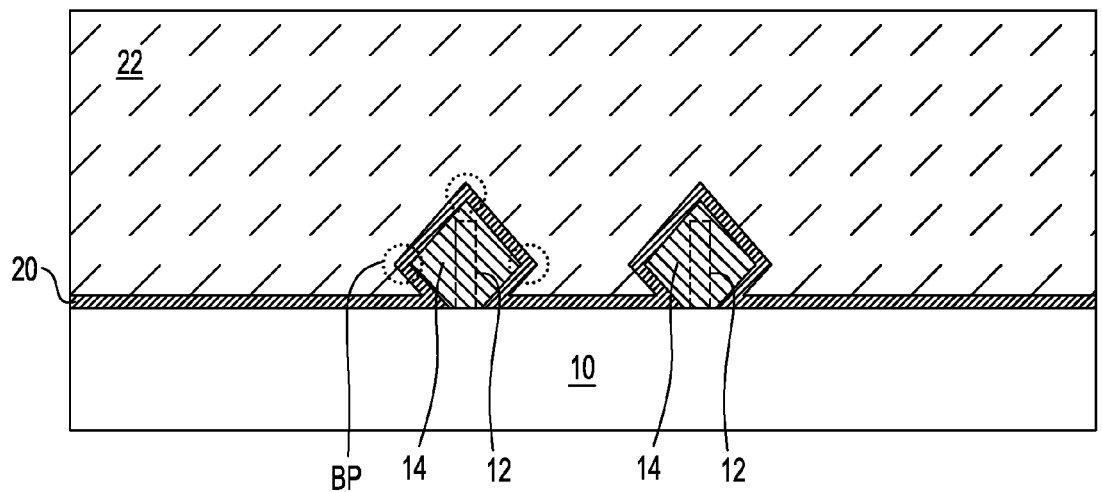
FIG. 5 is a cross sectional view of the exemplary semiconductor structure of FIG. 4 after forming an anti-fuse metal structure on the dielectric liner.

Referring now to FIG. 5, there is illustrated the exemplary semiconductor structure of FIG. 4 after forming an anti-fuse metal structure 22 on the dielectric liner 20. Anti-fuse metal structure 22 is formed on an exposed surface of the topmost surface of the dielectric liner 20.

The anti-fuse metal structure 22 is composed of a same metal-containing conductive material as that used in providing a gate conductor (or gate electrode) of a functional gate structure (not shown). The metal-containing conductive material used in providing anti-fuse metal structure 22 as well as the gate conductor of the functional gate structure can include, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one example, the metal-containing conductive material used in providing anti-fuse metal structure 22 as well as the gate conductor of the functional gate structure may include aluminum (Al), copper (Cu), titanium (Ti), tungsten (W), cobalt (Co) or alloys thereof such as, for example, TiAl, or CuAl.

The metal-containing conductive material used in providing anti-fuse metal structure 22 may be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. A planarization process such as, for example, CMP, may follow the deposition process.

In some embodiments of the present application, a middle-of-the line (MOL) dielectric material (not shown) can be formed above the anti-fuse metal structure 22, and then one or more contact structures (also not shown) can be formed through the MOL dielectric material. The MOL dielectric material may include any conventional MOL dielectric material and it can be formed utilizing any conventional deposition process. A planarization process may or may not be performed following the deposition of the MOL dielectric material. The contact structures can include any conventional contact material including contact metals such as, for example, Al, W, or Cu, and they can be formed utilizing any technique well known to those skilled in the art. For example, each contact structure may be formed by first forming a contact opening in the MOL dielectric by utilizing a patterning process such as, for example, lithography and etch. A contact material can then be formed into each contact opening utilizing a deposition process. A planarization process may or may not be performed after depositing the contact material.

FIG. 5 illustrates an exemplary semiconductor structure of the present application that includes an anti-fuse structure located on a surface of a substrate 10. The anti-fuse structure comprises a semiconductor fin 12 extending upward from a portion of the substrate 10, a doped semiconductor material structure 14 having a faceted surface surrounding the semiconductor fin 12, a dielectric liner 20 located on the substrate 10 and the doped semiconductor material structure 14, and an anti-fuse metal structure 22 located on the dielectric liner 20. The anti-fuse structure of the present application includes multiple breakdown points, BP, located at the apexes of the doped semiconductor material structure 14. In some embodiments in which the doped semiconductor material structure 14 is diamond shaped, three breakdown points, BP, are present in the anti-fuse structure of the present application.

The anti-fuse structure of the present application may have reduced breakdown voltage due to field enhancement at the apexes of the faceted surface of the doped semiconductor material structure 14. Further, and due to the large contact area provided by the multiple breakdown points, BP, the anti-fuse structure of the present application has a low resistance after the anti-fuse structure is blown.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
 an anti-fuse structure located on a surface of a substrate, the anti-fuse structure comprising:
  a semiconductor fin extending upward from a portion of the substrate;
  a doped semiconductor material structure having a faceted surface and contacting a topmost surface and an entirety of each sidewall surface of the semiconductor fin;
  a dielectric liner composed of a dielectric material and located directly on the substrate and an entirety of the doped semiconductor material structure; and
  an anti-fuse metal structure located on an entirety of the dielectric liner.

2. The semiconductor structure 1, wherein the doped semiconductor material structure is diamond shaped.

3. The semiconductor structure of claim 1, wherein the doped semiconductor material structure has an epitaxial relationship with the semiconductor fin.

4. The semiconductor structure of claim 1, wherein the doped semiconductor material structure has a dopant concentration from $2\times10^{20}$ atoms/cm$^3$ to $2\times10^{21}$ atoms/cm$^3$.

5. The semiconductor structure of claim 1, wherein the doped semiconductor material structure is composed of a same semiconductor material as the semiconductor fin.

6. The semiconductor structure of claim 1, wherein the doped semiconductor material structure is composed of a different semiconductor material than the semiconductor fin.

7. The semiconductor of claim 1, wherein the dielectric liner comprises a dielectric material having a dielectric constant greater than silicon dioxide.

8. The semiconductor structure of claim 1, wherein the substrate is an insulator layer or a remaining portion of a bulk semiconductor substrate.

9. The semiconductor structure of claim 1, further comprising additional semiconductor fins extending upward from other portions of the substrate, wherein each additional semiconductor fin comprises additional doped semiconductor material structures having a faceted surface surrounding each additional semiconductor fin, wherein each doped semiconductor material structure is spaced apart from one another by a gap, and wherein the dielectric liner and the anti-fuse metal structure are located above each additional doped semiconductor material structure.

10. The semiconductor structure of claim 2, wherein the doped semiconductor material structure has three breakdown points located at the apexes of the diamond shaped doped semiconductor material structure.

11. A method of forming an anti-fuse structure, the method comprising:
forming a semiconductor fin extending upward from a surface of a substrate and in an anti-fuse device region of the substrate;
forming a doped semiconductor material structure having a faceted surface on a physically exposed topmost surface and an entirety of each physically exposed sidewall surface of the semiconductor fin;
forming a dielectric liner composed of a dielectric material directly on the substrate and on an entirety of the doped semiconductor material structure; and
forming an anti-fuse metal structure on an entirety of the dielectric liner.

12. The method of claim 11, wherein the doped semiconductor material structure is diamond shaped.

13. The method of claim 11, wherein said forming the doped semiconductor material structure comprises epitaxial growth.

14. The method of claim 11, wherein the doped semiconductor material structure has a dopant concentration from $2 \times 10^{22}$ atoms/cm$^3$ to $2 \times 10^{21}$ atoms/cm$^3$.

15. The method of claim 11, wherein the doped semiconductor material structure is composed of a same semiconductor material as the semiconductor fin.

16. The method of claim 11, wherein the doped semiconductor material structure is composed of a different semiconductor material than the semiconductor fin.

17. The method of claim 11, wherein the dielectric liner comprises a dielectric material having a dielectric constant greater than silicon dioxide.

18. The method of claim 11, wherein the substrate is an insulator layer or a remaining portion of a bulk semiconductor substrate.

19. The method of claim 11, wherein said forming the semiconductor fin comprises:
providing a plurality of semiconductor fins extending upwards from different portions of the substrate; and
removing a predetermined number of the semiconductor fins of the plurality of the semiconductor fins, while maintaining some of the semiconductor fins, wherein said doped semiconductor material structure is formed on each remaining semiconductor fin of the plurality of semiconductor fins and each doped semiconductor material structure is separated from each other by a gap, and said dielectric liner and said anti-fuse metal structure are present above each remaining semiconductor fin.

20. The method of claim 12, wherein the doped semiconductor material structure has three breakdown points located at the apexes of the diamond shaped doped semiconductor material structure.

* * * * *